United States Patent
Ueda et al.

(10) Patent No.: US 6,933,009 B2
(45) Date of Patent: Aug. 23, 2005

(54) THIN-FILM DEPOSITION METHOD

(75) Inventors: Masashi Ueda, Tokyo (JP); Tomoko Takagi, Tokyo (JP)

(73) Assignee: Ishikawajima-Harima Heavy Industies Co., Ltd., Tokyo (JP)

( * ) Notice: Subject to any disclaimer, the term of this patent is extended or adjusted under 35 U.S.C. 154(b) by 0 days.

(21) Appl. No.: 10/428,849

(22) Filed: May 5, 2003

(65) Prior Publication Data

US 2003/0203124 A1 Oct. 30, 2003

Related U.S. Application Data

(63) Continuation of application No. 09/749,681, filed on Dec. 28, 2000, now abandoned.

(30) Foreign Application Priority Data

Dec. 28, 1999 (JP) ............................................ 11-374422

(51) Int. Cl.⁷ .............................................. C23C 16/00
(52) U.S. Cl. ...................... 427/248.1; 427/569; 427/58; 427/294
(58) Field of Search .............................. 427/248.1, 569, 427/58, 294

(56) References Cited

U.S. PATENT DOCUMENTS 4,109,157 A * 8/1978 Tanaka et al. ......... 422/186.05

FOREIGN PATENT DOCUMENTS

| JP | 05-295551 | * 11/1993 |
| JP | 11-118356 | * 4/1999 |

* cited by examiner

*Primary Examiner*—Bret Chen
(74) *Attorney, Agent, or Firm*—Manabu Kanesaka

(57) ABSTRACT

In a thin-film deposition method, a substrate is placed in a heat chamber having a pressure equal to or higher than an atmospheric pressure, and the substrate is heated in the heat chamber by supplying gas having a temperature higher than a room temperature by forced convection. The heated substrate is transferred from the heat chamber into a deposition chamber which is a vacuum chamber connected to the heat chamber directly or indirectly with a valve interposed therebetween. Then, a thin-film deposition is carried out on the substrate in the deposition chamber at a deposition temperature higher than the room temperature.

13 Claims, 5 Drawing Sheets

THIN-FILM DEPOSITION METHOD

CROSS REFERENCE TO RELATED APPLICATION

This is a continuation application of patent application Ser. No. 09/749,681 filed on Dec. 28, 2000 now abandoned.

BACKGROUND OF THE INVENTION AND RELATED ART STATEMENT

The present invention relates to a thin-film deposition method for depositing a thin-film on a substrate. A thin-film deposition method has been widely used for manufacturing an electronic device such as an LSI (large-scale integrated circuits) and a display device such as a liquid crystal display. In addition, the thin-film deposition method may be used for manufacturing a solar cell.

The solar cell technology has been conventionally in practical use for an electronic calculator. The technology is expected to use as electric power generating technology as energy problems increase, as seen in New Sunshine Program of MITI (Ministry of International Trade and Industry, Japan).

The Solar cell is divided into two types. One is a silicon solar cell, while the other one is a compound semiconductor solar cell. The silicon solar cell includes a crystallized solar cell such as a single crystalline silicon solar cell and a poly-crystalline silicon solar sell. Further, a great deal of effort has been made to make an amorphous silicon solar cell practical. This is because the amorphous silicon solar cell has an advantage of using a thinner semiconductor layer because of a higher light absorption coefficient, as well as a lower manufacturing cost. In addition, the amorphous solar cell is using an abundant gas as a raw material. Contrarily, the crystal silicon solar cell is using crystal silicon as a raw material that is a limited resource.

In manufacturing the amorphous solar cell, it is necessary to deposit a thin-film on a substrate made of glass, metal or resin. Therefore, a thin-film deposition apparatus is used. In the case of the typical amorphous solar cell, technique of plasma enhanced chemical vapor deposition (CVD) using a mixture of silane gas and hydrogen gas is often adopted. For example, a hydrogenated amorphous silicon film is deposited on a substrate by generating HF (high frequency) discharge in a mixture of silane gas and hydrogen gas to decompose the silane.

In thin-film deposition apparatuses, a temperature of a substrate that is maintained at a specified value during deposition, hereinafter called "deposition temperature", is often higher than a room temperature. In CVD, the deposition temperature is set higher than the room temperature on purpose that the final reaction could take place by thermal energy, or, the deposition rate and the film quality could be improved. In this case, it is required to provide a process of heating the substrate prior to the deposition.

A heat chamber having a radiation lamp-heater therein is usually used for heating the substrate. The heat chamber is connected air-tightly with a deposition chamber through a valve. The substrate is heated in the heat chamber up to the deposition temperature in vacuum, and is transferred to the deposition chamber for the film deposition. An internal environment of the apparatus is often a vacuum pressure of about 10 Pa or lower. Therefore, the radiation heating is employed, as heat conduction and convection are not expected to be effective in the chamber.

A load-lock chamber is often connected with the deposition chamber so that the deposition chamber is not directly exposed to the atmosphere. A load-lock chamber having the radiation lamp-heater is used as the heating chamber.

However, the above-described radiation heating has problems as follows. First of all, the radiation heating has a high running cost as heating efficiency of the radiation heating is lower than other heating methods. In addition, when a larger substrate is employed, which often happens in the solar cell manufacture, an apparatus cost is increased remarkably because many long radiation lamp-heaters must be provided. Moreover, it is required to consider an issue of energy-payback-time reduction, in which it is necessary to produce a solar cell with energy less than the electric energy the solar cell generates. In this point of view, the radiation heating is not a favorable method because the energy consumption easily increases in the manufacturing process.

In addition, the radiation heating has a problem of having an overshoot when a feed-back-control of the substrate temperature is carried out, because the substrate temperature rapidly rises when irradiation on the substrate starts. That is, the substrate temperature becomes a target value only after exceeding the target value. When the overshoot happens, a thermal stress is generated in the substrate, and the substrate may deform or break, or the stress might remain in the substrate.

In addition, it is important to improve the accuracy of controlling the substrate temperature during the heating to secure the film quality and the reproducibility. However, it is difficult to control the substrate temperature with the high accuracy in the radiation heating. For the high-accuracy control, it is preferable to measure the substrate temperature by a high-performance radiation thermometer. Contrarily, it is difficult to measure the substrate temperature by the radiation thermometer during the radiation heating, because additional radiant ray reflects on the substrate surface other than the infrared ray associated with the substrate temperature.

It is also possible to measure the substrate temperature by a thermocouple. However, in many cases, it is difficult to contact the thermocouple with the substrate. The thermocouple is not suitable for the high-accuracy temperature measurement. Especially, when the substrate is placed in a vacuum, a temperature difference occurs at the contact point between the substrate and the thermocouple because there is no convection to equalize the atmospheric temperature, thereby decreasing the measurement accuracy of the thermocouple.

In addition, the radiation heating has an essential problem in the solar cell manufacturing. In a structure of the solar cell, at least one side of a photovoltaic layer needs an optical transparent electrode. For example, in manufacturing the amorphous silicon solar cell, the amorphous silicon film is often deposited on a TCO (Transparent Conductive Oxide) film formed on the substrate. The TCO film has a characteristic of high infrared-ray reflectivity. Therefore, it is very difficult to effectively heat the substrate having the TCO film using the radiation heating.

Other than the radiation heating, there is a method of heating the substrate using the heat conduction. In this method, a plate with a high thermal conductivity is attached to a backside of the substrate. This plate is called "backing plate". When the backing plate is heated, the substrate is heated through heat transfer by the conduction from the backing plate to the substrate. However, when the issue of the energy-payback-time reduction is considered, the backing plate is not used, so this method cannot be employed. In addition, it is difficult to contact the baking plate with the substrate sufficiently and uniformly. Therefore, it is difficult to heat the substrate effectively and uniformly.

In addition, in the backing plate method, the substrate is heated only from the backside. As a result, a temperature difference in the thickness direction occurs when a thick substrate is used. The substrate may suffer a thermal deformation before heated up to a required temperature.

There may be another method of heating the substrate from both sides by radiation. Even if this method is adopted, it is difficult to maintain the uniform heating from both sides because the TCO film on one side of the substrate absorbs little infrared ray. Particularly, if the substrate is heated in a vacuum pressure using this method, it is very difficult to heat the substrate uniformly from both sides because there is little heat transfer through the convection and the conduction.

An object of the present invention is to solve problems described above, and to provide a thin-film deposition method having an efficient heating process without using the conventional radiation heating process.

Further objects and advantages of the invention will be apparent from the following description.

SUMMARY OF THE INVENTION

To accomplish the objects, according to the present invention, a thin-film deposition method including the steps of placing a substrate in a heat chamber having an inner pressure equal to or higher than an atmospheric pressure; heating the substrate in the heat chamber by supplying gas having a temperature higher than a room temperature through forced convection; transferring the heated substrate from the heat chamber into a deposition chamber in a vacuum state and connected directly or indirectly to the heat chamber through a valve; and carrying out a thin-film deposition on the substrate in the deposition chamber at a deposition temperature higher than the room temperature.

The substrate may be heated up to the deposition temperature or a temperature higher than the deposition temperature in the heat chamber.

Further, according to the present invention, a thin-film deposition method includes the steps of placing a substrate in a heat chamber having an inner pressure equal to or higher than an atmospheric pressure; heating the substrate in the heat chamber by supplying gas having a temperature higher than a room temperature through forced convection; transferring the heated substrate from the heat chamber into a load-lock chamber in a vacuum state and connected directly or indirectly to the heat chamber through a valve; transferring the heated substrate from the load-lock chamber into a deposition chamber in a vacuum state and connected directly or indirectly to the load-lock chamber through a valve, and carrying out thin-film deposition on the substrate in the deposition chamber at a deposition temperature higher than the room temperature.

A temperature-decrease prevention mechanism may be provided in the load-lock chamber to prevent the substrate temperature from being lower than the deposition temperature.

To accomplish the objects, the invention presents a thin-film deposition apparatus, comprising; a deposition chamber which is a vacuum chamber where thin-film deposition is carried out on a substrate at a deposition temperature higher than room temperature, and a heat chamber connected directly or indirectly with the deposition chamber, wherein the substrate is heated in the heat chamber under the atmospheric pressure or a pressure higher than the atmospheric pressure, and the substrate is heated by supplying gas having a temperature higher than the room temperature through forced convection.

To accomplish the objects, the invention also presents a thin-film deposition apparatus, comprising; a deposition chamber which is a vacuum chamber where thin-film deposition is carried out on a substrate at a deposition temperature higher than room temperature, a load-lock chamber which is a vacuum chamber where the substrate stays temporarily while the substrate is transferred from the atmosphere to the deposition chamber, and a heat chamber where the substrate is heated under the atmospheric pressure or a pressure higher than the atmospheric pressure, wherein the heat chamber, the load-lock chamber and the deposition chamber are connected directly or indirectly in this order interposing a valve, and the heat chamber has a mechanism to heat the substrate by supplying gas having a temperature higher than the room temperature through forced convection.

DETAILED DESCRIPTION OF PREFERRED EMBODIMENTS

Figure 1:
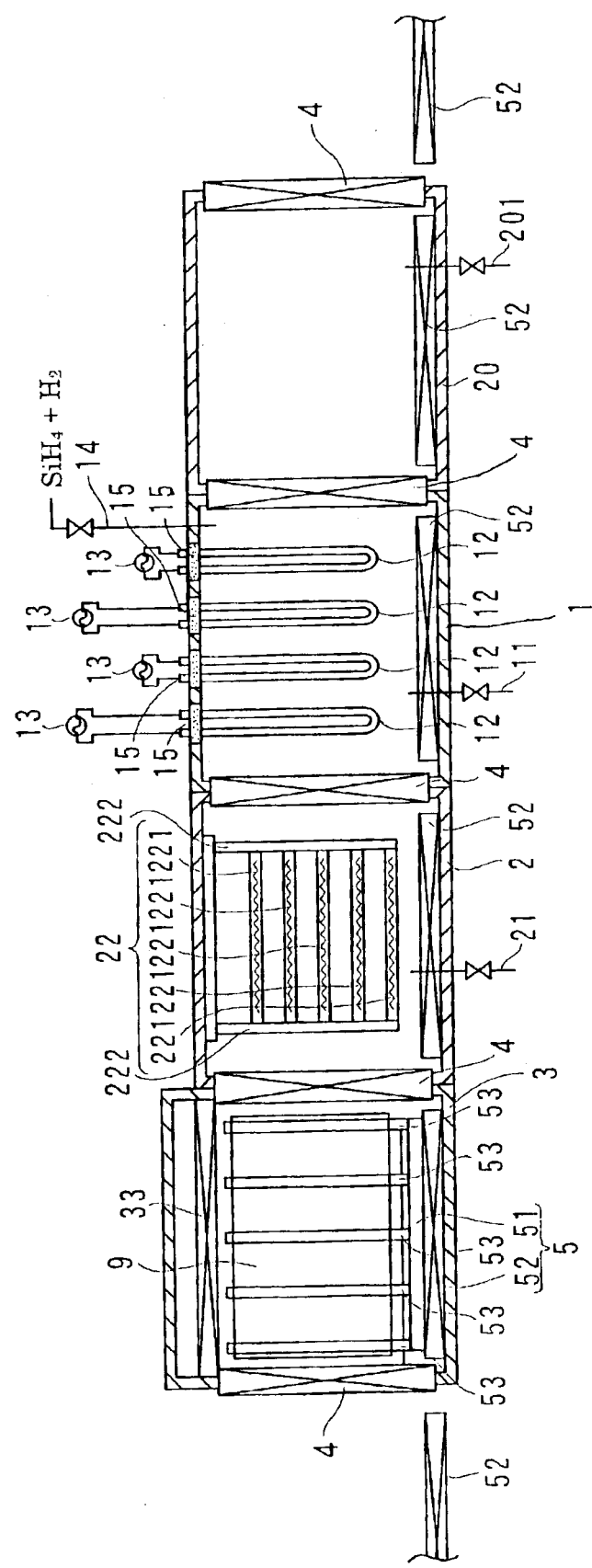
FIG. 1 shows a front sectional view of a thin-film deposition apparatus.

Hereunder, embodiments of the present invention will be described with reference to the accompanying drawings. FIG. 1 shows a front sectional view of a thin-film deposition apparatus as a preferred embodiment of this invention. The apparatus shown in FIG. 1 comprises a deposition chamber 1 where a thin-film deposition is carried out on substrates 9 at a deposition temperature higher than room temperature, a couple of load-lock chamber 2 and unload rock chamber 20 where substrates 9 stay temporarily while substrates 9 are transferred between deposition chamber 1 and an atmosphere, and a heat chamber 3 which heats substrates 9 under a pressure higher than the atmospheric pressure. Heat chamber 3, load-lock chamber 2, deposition chamber 1 and unload rock chamber 20 are connected air-tightly in this order with interposing valves 4. A transfer mechanism 5 which transfers substrates 9 between the atmosphere and chambers 3, 2, 1, and 20 is provided.

Valves 4 open and close the openings provided at each boundary between chambers 3, 2, 1, and 20 for transferring substrates 9. As valves 4, a gate-valve is suitable. The gate-valve is the valve used at a linear vacuum path and can make the path clear with no obstacle remaining when the valve is opened.

Deposition chamber 1, load-lock chamber 2 and unload rock chamber 20 are vacuum chambers, which comprise a pumping system 11, 21, and 201, respectively. Though heat chamber 3 is an airtight chamber, it has no pumping system.

Figure 2:
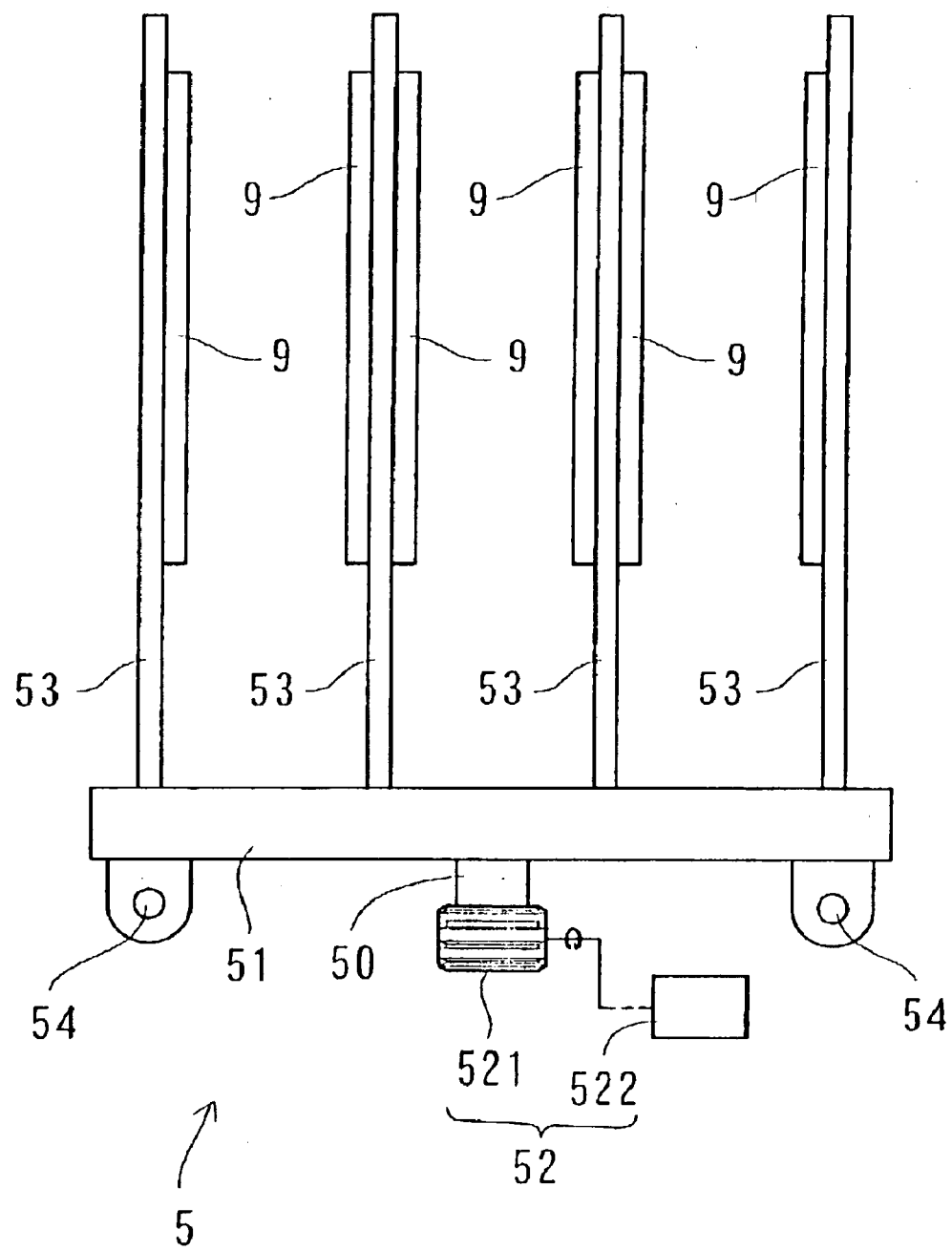
FIG. 2 shows a side schematic view of a transfer mechanism.

The composition of transfer mechanism 5 is described using FIG. 1 and FIG. 2. FIG. 2 shows a side schematic view of transfer mechanism 5. Transfer mechanisms 5 is a kind of rack-and-pinion mechanism. Transfer mechanism 5 is mainly composed of a rack board 51 provided horizontally with rack 50 underneath it and pinion mechanism 52 that transfer rack board 51 to a horizontal direction, i.e., vertical to the paper of FIG. 2. Each pinion mechanism 52 is composed of a number of pinions 521 engaged with rack 50 and motors 522 that rotate each pinion 521 to move rack board 51 horizontally. Linear guides 54 guiding the movement of rack board 51 are provided.

As shown in FIG. 1 and FIG. 2, supports 53 are provided uprightly on rack board 51. Each support 53 has hooks (not shown) holding substrates 9. A number of pinions 521 are placed at certain intervals along the transfer direction. As shown in FIG. 1, pinion mechanisms 52 are provided at one side of the atmosphere, inside of heat chamber 3, inside of load-lock chamber 2, inside of deposition chamber 1, inside of unload rock chamber 20 and the other side of the atmosphere. Each pinion mechanism 52 is operated in order so that rack board 51 can be transferred from one side of the atmosphere to the other side through heat chamber 3, load-lock chamber 2, deposition chamber 1 and unload rock chamber 20.

As understood from FIG. 1 and FIG. 2, rack board 51 has a rectangular shape, whose length direction is the transfer direction. Substrates 9 also have a rectangular shape. Substrates 9 are held by supports 53, making its surface vertical and its length direction along the transfer direction. As shown in FIG. 2, six substrates 9 are arranged and held with one rack board 51 in this embodiment. When rack board 51 is moved, six substrates 9 held by supports 53 are transferred at the same time.

A part of transfer mechanism 5 may be provided outside chambers 1, 2, 3, and 20. For example, a mechanism magnetically coupling through a wall of chambers 1, 2, 3, and 20 can be adopted. An actuator provided at the atmosphere drives a mechanism holding substrates 9 in chambers 1, 2, 3, and 20. This composition is preferable because mechanisms that are easy to produce dusts or contaminant can be provided outside chambers 1, 2, 3, and 20.

Figure 3:
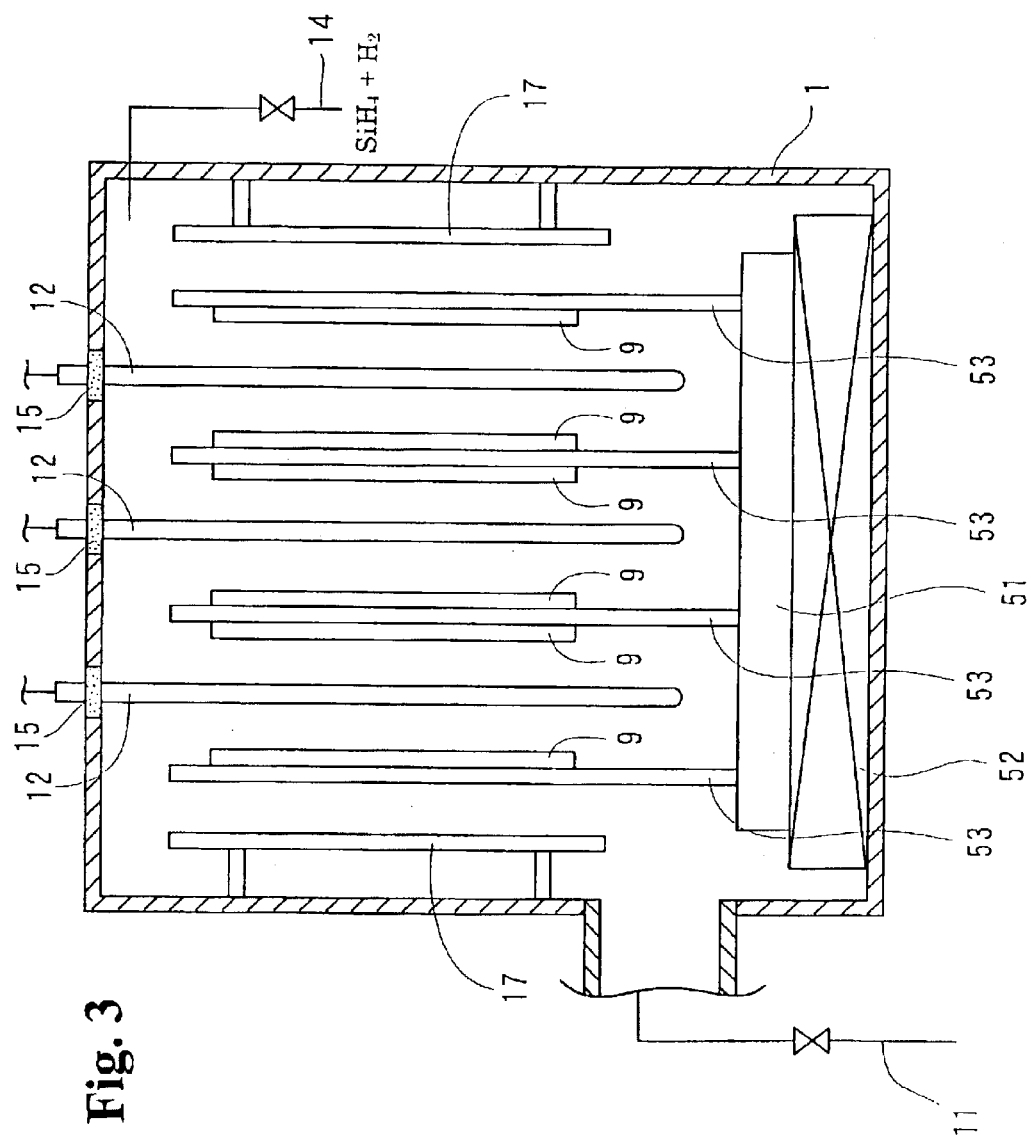
FIG. 3 shows a side schematic view of a deposition chamber.

Next, the composition of deposition chamber 1 is described using FIG. 1 and FIG. 3. FIG. 3 shows a side schematic view of deposition chamber 1. This embodiment has a composition where an amorphous silicon film is deposited in deposition chamber 1 by the HF plasma CVD method. Here, frequencies between LF (Low Frequency) and UHF (Ultra-High Frequency) are defined as HF (High Efficiency). Specifically, deposition chamber 1 comprises HF electrodes 12 provided in deposition chamber 1, HF power supplies 13 which apply HF power to HF electrodes 12 and a gas introduction system 14 which introduces the gas mixture of silane and hydrogen into deposition chamber 1.

HF electrodes 12 are elongated downward from the upper wall of deposition chamber 1. HF electrodes 12 are formed like antenna. Each HF electrode 12 is a U-shaped metal rod. Both ends of each HF electrode 12 are fixed air-tightly with insulation block 15 provided at the upper wall of deposition chamber 1. Both ends of HF electrodes 12 are connected to HF power supplies 13.

When HF power supplies 13 apply the HF power to HF electrodes 12 in a state of the gas mixture of silane and hydrogen introduced by gas introduction system 14, HF discharges are generated in the gas mixture to form plasmas. Silane decomposes in the plasmas, resulting in that the hydrogenated amorphous silicon film is deposited on the surface of the substrate 9 placed on both sides of HF electrodes 12.

Figure 4:
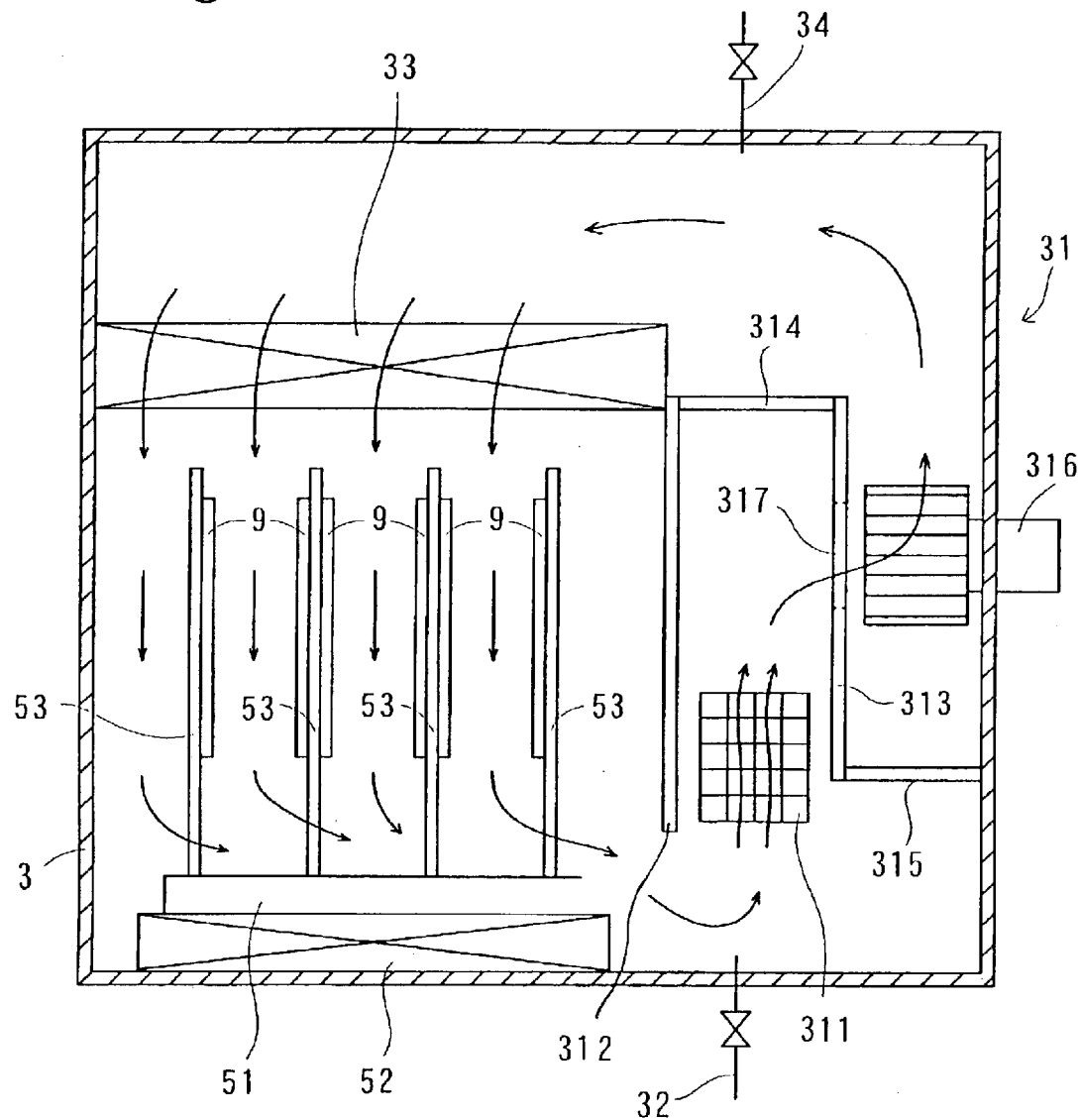
FIG. 4 shows a side schematic view of a heat chamber.

Points greatly characterizing this embodiment are in the composition of heat chamber 3. These points are described as follows using FIG. 4. FIG. 4 shows a side schematic view of heat chamber 3.

One point greatly characterizing this embodiment is that the means of heating is provided not in load-lock chamber 2 but separately provided in heat chamber 3. The means of heating in this embodiment is a heating mechanism 31 provided in heat chamber 3. Another point greatly characterizing this embodiment is that substrates 9 are heated at a pressure higher than the atmospheric pressure utilizing forced convection.

Specifically, heat chamber 3 comprises valves 4 at each boundary to the atmosphere and to load-lock chamber 2. Pressurizing gas supply system 32 that supplies compressed air or dry air into heat chamber 3 to pressurize it is provided. Heating mechanism 31 in heat chamber 3 is composed mainly of heat source 311, baffle plates 312, 313, 314, and 315 that form an air flow path, and air blower 316 blowing air through the air flow path for circulating inside heat chamber 3.

Heat source 311 has high energy efficiency such as combustion equipment used with a boiler. Heat source 311 produces heat of 4000 joule/second, i.e., 60000 Kcal/hour, using City gas as fuel. Instead of City gas, liquefied petroleum gas (LPG) may be used as fuel. A centrifugal turbo fan is used as air blower 316. Baffle plate 312 (hereinafter called the first baffle plate 312) separates the region at which substrates 9 are placed and the region at which heat source 311 is provided. Heat source 311 is put between baffle plate 312 and baffle plate 313 (hereinafter called the second baffle plate 313). Baffle plate 314 (hereinafter called the third baffle plate 314) shuts the space between the upper end of the first baffle plate 312 and the upper end of the second baffle plate 313. Baffle plate 315 (hereinafter called the fourth baffle plate 315) shuts the space between the bottom end of the second baffle plate 313 and the wall of heat chamber 3.

Second baffle plate 313 is provided with a circulation hole 317. Air blower 316 is fixed on the sidewall of heat chamber 3 at the same height as circulation hole 317. When air blower 316 is operated, air heated by heat source 311 is introduced into the upper space through circulation hole 317.

Filter 33 is provided above the region where substrates 9 are placed. Filter 33 is flush with the third baffle plate 314 at its bottom end. Filter 33 traverses the air flow path. Heated air blowing from air blower 316 flows between the third baffle plate 314 and the upper wall of heat chamber 3, and reaches the space above filter 33. The heated air flows to substrates 9 through filter 33 knocking on the wall of heat chamber 3, so that substrates 9 are heated.

Filter 33 is used to prevent substrates 9 from contamination. A HEPA filter (High-Efficiency Particle Air filter) with heat-resistance up to about 250° C. is preferably used as filter 33. A heat insulator is provided at the wall of heat chamber 3 if necessary.

As designated by arrows in FIG. 4, the heated air heats substrates 9, when it flows down from the upper space to the bottom space. Then, the air reaches between the first baffle plate 312 and the second baffle plate 313, knocking on the bottom wall of heat chamber 3. Consequently, the air is heated again by heat source 311 and blows out from air blower 316. Rack board 51 and pinion mechanism 52 are designed to pass the heated air sufficiently.

Substrates 9 are heated higher than the deposition temperature by heating mechanism 31 as described. Showing an example, in case the amorphous silicon film is deposited, the deposition temperature is about 200° C. In this case, substrates 9 must be heated in heating chamber 3 up to about 230° C. Heating mechanism 31 is designed so that the temperature of the heated air can become about 250° C. and the flow rate of the heated air can be maintained at about 100 m³ per minute. With this composition, substrates 9 are heated up to about 230° C. within ten to fifteen minutes.

Figure 5:
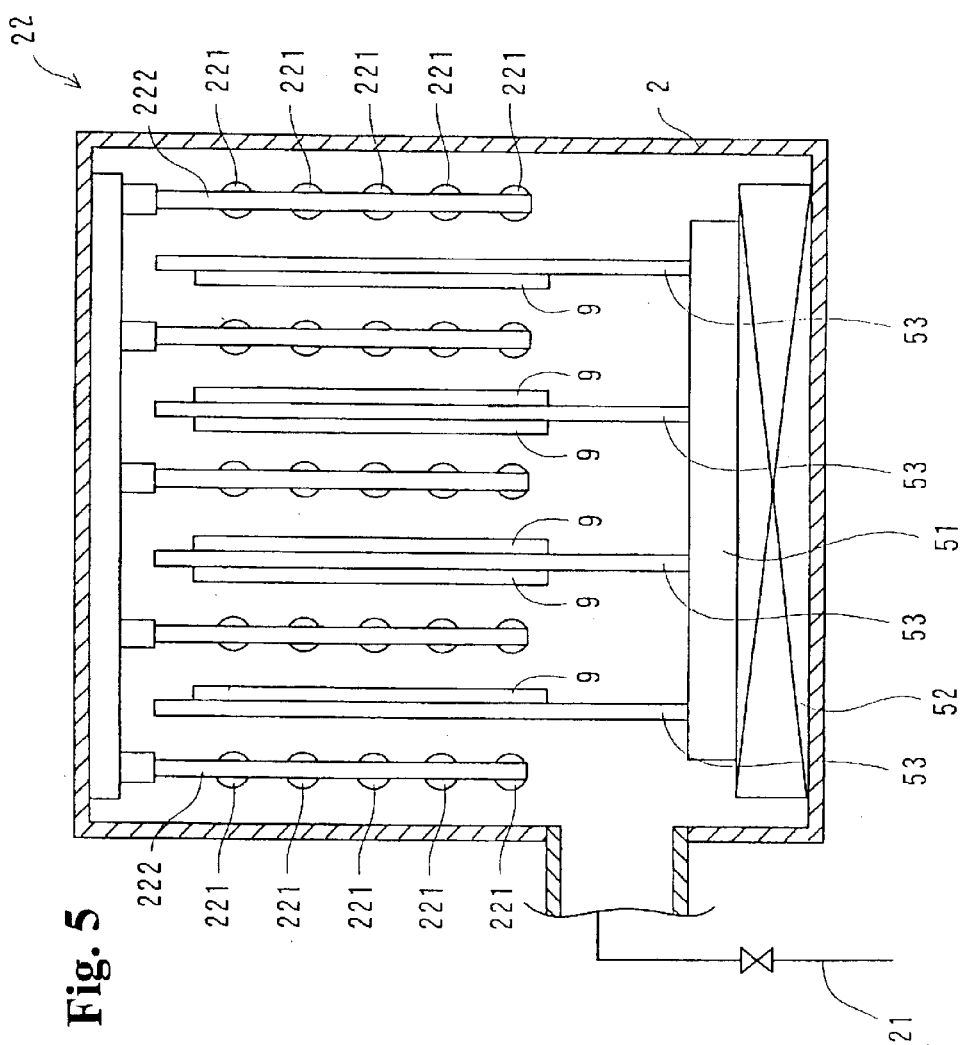
FIG. 5 shows a side schematic view of a load-lock chamber.

On the other hand, in this embodiment, a temperature-decrease prevention mechanism 22 is provided in load-lock chamber 2. Temperature-decrease prevention mechanism 22 prevents the substrate temperature from decreasing lower than the deposition temperature. This point is described using FIG. 1 and FIG. 5. FIG. 5 shows a side schematic view of load-lock chamber 2.

Radiation lamp-heaters 221 are employed as temperature-decrease prevention mechanism 22 in this embodiment. Radiation lamp-heaters 221 are rod-shaped filament lamps such as halogen lamps. Radiation lamp-heaters 221 are posed horizontally and aligned vertically. Radiation lamp-heaters 221 are held at both ends together with holders 222 in which a feeding line is provided. Units of radiation lamp-heaters 221 and a couple of holder 222 are arranged between two substrates 9 and between a substrate 9 and the wall of load-lock chamber 2.

When the infrared absorption coefficient of substrates 9 is poor such as in the case substrates 9 have a TCO film as described, it is difficult to heat substrates 9 by radiation lamp-heaters 221. However, in this embodiment, the heating in load-lock chamber 2 is supplementary because heating mechanism 31 in heat chamber 3 heats substrate 9 higher than the deposition temperature. In other words, heating is enough if the substrate temperature does not become lower than the deposition temperature while substrates 9 stay in load-lock chamber 2. Considering this point, radiation lamp-heaters 221 are employed as temperature-decrease prevention mechanism 22 in this embodiment.

Showing a more-detailed example, about fifteen lamps of about 1 kW are used for each substrate 9 as temperature-decrease prevention mechanism 22, in case that substrates 9 are heated up to about 230° C. in heat chamber 3, the deposition temperature is 200° C., and substrates 9 are placed in load-lock chamber 2 for about nine minutes. In this example, the pressure in load-lock chamber 2 is about 1 Pa.

Heating quantity of radiation lamp-heaters 221 is decided according to how high temperature substrates 9 are heated to in heat chamber 3. In addition, it should be considered how much the substrate temperature decreases by heat dissipation while substrates 9 are transferred from heat chamber 3 to deposition chamber 1, and how much heat substrates 9 receive from radiation lamp-heaters 221 of temperature-decrease prevention mechanism 22 in load-lock chamber 2. It is preferable that the substrate temperature is just the same as the deposition temperature when substrates 9 reach deposition chamber 1.

Next, whole operation of the apparatus of this embodiment is described.

To begin with, substrates 9 are set to rack board 51 at a platform (not shown). Each support 53 holds substrates 9. After the valve 4 on the atmosphere side of heat chamber 3 is opened, transfer mechanism 5 is operated to transfer substrates 9 into heat chamber 3. The pressure in heat chamber 3 is always maintained a little higher than the atmospheric pressure by pressurizing gas supply system 32.

After closing the valve 4, air blower 316 is operated to cause the forced convection, thereby heating substrates 9. Heat source 311 is operated all the time while the apparatus is available. Air blower 316 may be operated all the time as well.

After heating substrates 9 up to a specified temperature, a valve on pressurizing gas supply system 32 is closed. Substrates 9 are transferred to load-lock chamber 2 after valve 4 between heat chamber 3 and load-lock chamber 2 is opened. After closing the valve 4, load-lock chamber 2 is pumped by pumping system 21 to a specified vacuum pressure. Substrates 9 are transferred to deposition chamber 1 after valve 4 between load-lock chamber 2 and deposition chamber 1 is opened.

Next, after the valve 4 is closed the deposition onto substrates 9 is carried out in deposition chamber 1 as described. Substrates 9 are transferred out to the atmosphere via unload-lock chamber 20 after the deposition. Substrates 9 are taken out from each support 53 on rack board 51 at another platform (not shown).

The apparatus of this embodiment described above brings a merit that the energy efficiency is higher and the running cost is lower because heating mechanism 31 provided in heat chamber 3 heats substrates 9 not by the radiation but by the forced convection. Particularly, the apparatus of this embodiment is suitable for the manufacture of solar cells for power supply because it requires the energy-payback-time reduction.

Substrates 9 are heated sufficiently even if those infrared ray absorption coefficients are poor as in case of the substrate with the TCO film, because substrates 9 are heated not by the radiation but by the forced convection. This point is another reason why this embodiment is suitable for the manufacture of solar cells.

Problems of the overshoot and the thermal deformation of substrates 9 do not arise in this embodiment, because substrates 9 are not heated rapidly as in case of the radiation heating. In addition, it is possible to measure the substrate temperature with high accuracy by a radiation thermometer. Therefore, the temperature control of substrates 9 can be carried out with high accuracy.

The composition where substrates 9 are heated to a temperature higher than the deposition temperature also contributes to enhancing energy efficiency. It is possible to heat substrates 9 at a temperature lower than the deposition temperature in heat chamber 3 and thereafter heat substrates 9 up to the deposition temperature in load-lock chamber 2 or deposition chamber 1. However, it is difficult to heat substrates 9 efficiently in load-lock chamber 2 or deposition chamber 1 because those are vacuum chambers where the convection heating cannot be utilized. Therefore, heating in load-lock chamber 2 or deposition chamber 1 must be the radiation heating. As described, the radiation heating has the low energy efficiency. The radiation heating of the substrate with the TCO film is essentially impossible. Contrarily, when substrates 9 are heated higher than the deposition temperature in heat chamber 3 as in this embodiment, the radiation heating of the low efficiency is not required. Therefore, even the substrate with the TCO film can be heated sufficiently.

The merit of film quality improvement is brought from the composition that substrates 9 are transferred to deposition chamber 1 via load-lock chamber 2 after substrates 9 are heated to a temperature higher than the deposition temperature in heat chamber 3. To heat substrates 9 in heat chamber 3 brings the significance that adsorbed gas can be released sufficiently from substrates 9. Gas such as vapor is adsorbed to the surface of substrates 9. If the deposition is carried out in a state that adsorbed gas such as vapor has not been well released, adsorbed gas would be released rapidly to contaminate the deposited film or to cause a structural defect such as forming bubbles within it. When substrates 9 are heated prior to the deposition, these problems are prevented since adsorbed gas is well released in advance.

Now, how much quantity of adsorbed gas is released depends on how high temperature substrates 9 are heated and how long the temperature is kept. In this embodiment, substrates 9 are heated higher than the deposition temperature in heating chamber 3 and transferred to deposition chamber 1 via load-lock chamber 2, keeping almost the same temperature. Therefore, adsorbed gas is well released from substrates 9 by the time when substrates 9 arrive at deposition chamber 1. Contrarily, if the adsorbed gas release is carried out only by the heating in load-lock chamber 2, gas release is insufficient because high-temperature keeping time gets shorter. In this case, substrates 9 need to stay longer in load-lock chamber 2 so that adsorbed gas can be well released, resulting in that the productivity decreases and the running cost increases. Therefore, this composition is not preferable.

Another merit that substrates 9 are not required to be heated at so high temperature in heat chamber 3 is brought from the composition that temperature-decrease prevention mechanism 22 is provided in load-lock chamber 2. If temperature-decrease prevention mechanism 22 is not provided, there arises necessity to heat substrates 9 at so high temperature calculating the temperature decrease in load-lock chamber 2. In this composition, it would take longer time to heat substrates 9 in heat chamber 3. Otherwise, heating mechanism 31 would be required to be larger size. The cost of providing temperature-decrease prevention mechanism 22 and the running cost of this embodiment possibly would be lower than that.

Moreover, another merit that substrates 9 can be restrained from contamination while those are transferred from heat chamber 3 to deposition chamber 1 is brought from the composition that heat chamber 3 is a part of the apparatus, i.e., heat chamber 3 and deposition chamber 1 are connected air-tightly. If substrates 9 are temporarily taken out from the apparatus while those are transferred from heat chamber 3 to deposition chamber 1, substrates 9 may suffer from contamination such as adhesion of contaminants. The possibility of contamination is low when heat chamber 3 is connected with deposition chamber 1 directly or indirectly as shown in this embodiment.

It is possible to employ a chamber layout of the cluster-tool types where load-lock chamber 2, heat chamber 3 and deposition chamber 1 are provided around a transfer chamber in which a transfer robot is provided.

It is also possible to employ the composition where substrates 9 are heated just at the deposition temperature, though those are heated higher than the deposition temperature in this embodiment. The pressure in heat chamber 3 may be the same as the atmospheric pressure. Still, the pressure higher than the atmospheric pressure brings the advantage that contaminants would not be introduced into heat chamber 3. Inert gas such as nitrogen may be supplied into heat chamber 3 instead of compressed air or dry air at a pressure higher than the atmospheric pressure.

A ceramic heater may be used as temperature-decrease prevention mechanism 22 instead of radiation lamp-heaters 221. The heating in load-lock chamber 2 can be eliminated by heating substrates 9 in heat chamber 3 at a temperature higher enough than the deposition temperature. A specified heat-insulation mechanism may be used as temperature-decrease prevention mechanism 22 in load loch chamber 2.

Other than the hydrogenated amorphous silicon film deposition as described, the apparatus of the invention can carry out another amorphous silicon film deposition such as amorphous silicon fluoride film deposition, amorphous silicon carbide film deposition, amorphous silicon germanium firm deposition and the like. Phosphorus doped films or boron doped films also can be deposited by the apparatus of the invention.

The apparatus of the invention can be used for manufacture of liquid crystal displays or information storage disks other than solar cells. For example, the composition of the heating in this invention can be used for a thin-film deposition for a driver electrode in an LCD. Especially, sufficient gas release is required when an indium-tin-oxide (ITO) film is deposited by sputtering on a substrate with a color filter formed on it, because the color filter involves much water. Therefore, the apparatus of the invention that can carry out the gas release efficiently is suitable.

The composition of deposition chamber 1 is optimized according to a kind of deposition process. For example, a CVD not by an inductive coupled plasma but by a capacitive coupled plasma may be adopted. Physical depositions such as sputtering or ion-beam deposition can be adopted as well.

What is claimed is:

1. A thin-film deposition method, comprising:
   placing a substrate in a heat chamber having a pressure equal to or higher than an atmospheric pressure;
   heating the substrate at least to a deposition temperature in the heat chamber by supplying gas having a temperature higher than a room temperature by forced convection;
   transferring the heated substrate from the heat chamber into a load-lock chamber which is a vacuum chamber connected to the heat chamber directly or indirectly with a first valve interposed therebetween, in which a temperature-decrease prevention mechanism controls a temperature of the substrate to be equal to or higher than the deposition temperature;
   transferring the heated substrate from the load-lock chamber into a deposition chamber which is a vacuum chamber connected to the load-lock chamber directly or indirectly with a second valve interposed therebetween, and
   carrying out a thin-film deposition on the substrate in the deposition chamber at the deposition temperature higher than the room temperature.

2. A thin-film deposition method as claimed in claim 1, wherein the substrate is used for a solar cell.

3. A thin-film deposition method as claimed in claim 1, wherein in heating the substrate, the gas is heated by a hot source, and circulated by a blower through a path including baffle plates and the substrate to heat the substrate.

4. A thin-film deposition method as claimed in claim 3, wherein in heating the substrate, foreign material is removed from the heated gas by a filter.

5. A thin-film deposition method as claimed in claim 1, wherein in heating the substrate, the gas is heated by a hot source, and circulated by a blower through a path including baffle plates and the substrate to heat the substrate.

6. A thin-film deposition method as claimed in claim 1, wherein after transferring the substrate from the heat chamber into the load-lock chamber, the temperature-decrease prevention mechanism in the load-lock chamber heats the substrate as a heater to control the temperature of the substrate to be equal to or higher than the deposition temperature.

7. A thin-film deposition method as claimed in claim 1, wherein in carrying out the thin-film deposition, a plasma enhanced chemical vapor deposition is used where plasma is generated by supplying high frequency power to high frequency electrode.

8. A thin-film deposition method as claimed in claim 1, wherein, in placing the substrate in the heat chamber, said substrate is supported uprightly in the heat chamber.

9. A thin-film deposition method, comprising:

placing a plurality of substrates in a heat chamber having a pressure equal to or higher than an atmospheric pressure;

heating the plurality of the substrates at least to a deposition temperature in the heat chamber by supplying gas having a temperature higher than a room temperature by forced convection;

transferring the plurality of the substrates from the heat chamber into a load-lock chamber which is a vacuum chamber connected to the heat chamber directly or indirectly with a first valve interposed therebetween, in which a temperature-decrease prevention mechanism controls a temperature of the substrate to be equal to or higher than the deposition temperature;

transferring the plurality of the substrates from the load-lock chamber into a deposition chamber which is a vacuum chamber connected to the load-lock chamber directly or indirectly with a second valve interposed therebetween, and carrying out a thin-film deposition on the plurality of the substrates in the deposition chamber at the deposition temperature higher than room temperature.

10. A thin-film deposition method as claimed in claim 9, wherein the plurality of said substrates is supported on a board moving horizontally to transfer the substrates together.

11. A thin-film deposition method as claimed in claim 10, wherein the plurality of said substrates is supported uprightly on the board.

12. A thin-film deposition method as claimed in claim 10, wherein the plurality of said substrates is supported uprightly on the board in the heat chamber, the gas flowing along the surfaces of the substrates in the heating chamber to thereby heat the substrates.

13. A thin-film deposition method as claimed in claim 9, wherein, in carrying out the thin-film deposition on the plurality of the substrates in the deposition chamber, a high frequency electrode with an antenna shape is used for the thin-film deposition.

* * * * *